US010383226B2

(12) United States Patent
Chen et al.

(10) Patent No.: US 10,383,226 B2
(45) Date of Patent: Aug. 13, 2019

(54) MULTI-LAYER CIRCUIT STRUCTURE AND MANUFACTURING METHOD THEREOF

(71) Applicant: Unimicron Technology Corp., Taoyuan (TW)

(72) Inventors: Chang-Fu Chen, Taoyuan (TW); Chun-Hao Chen, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 15/836,923

(22) Filed: Dec. 11, 2017

(65) Prior Publication Data

US 2019/0116667 A1 Apr. 18, 2019

(30) Foreign Application Priority Data

Oct. 13, 2017 (TW) .............................. 106135062 A

(51) Int. Cl.
*H05K 3/46* (2006.01)
*H05K 1/11* (2006.01)
(Continued)

(52) U.S. Cl.
CPC ........... *H05K 1/115* (2013.01); *H05K 3/0023* (2013.01); *H05K 3/0026* (2013.01);
(Continued)

(58) Field of Classification Search
CPC ............................................. H05K 2201/096
(Continued)

(56) References Cited

U.S. PATENT DOCUMENTS

| 6,828,510 B1 * | 12/2004 | Asai | ................. H05K 3/387 174/255 |
| 8,003,896 B2 * | 8/2011 | Wu | ................. H05K 1/115 174/260 |

(Continued)

FOREIGN PATENT DOCUMENTS

| TW | 644882 | 8/2003 |
| TW | I283055 | 6/2007 |

OTHER PUBLICATIONS

Office Action of Taiwan Counterpart Application, dated Jul. 12, 2018, pp. 1-4.

*Primary Examiner* — Stanley Tso
(74) *Attorney, Agent, or Firm* — JCIPRNET

(57) ABSTRACT

A multi-layer circuit structure including a core layer, a first circuit structure, a second circuit structure, and a build-up circuit structure is provided. The first circuit structure and the second circuit structure are respectively disposed on two opposite surfaces of the core layer. The build-up circuit structure includes a first dielectric layer disposed on the first circuit structure, first conductive blind holes, a second dielectric layer disposed on the first dielectric layer, second conductive blind holes, and a patterned circuit layer disposed on the second dielectric layer. The first conductive blind holes penetrate through the first dielectric layer and electrically contact the first circuit structure. The second conductive blind holes penetrate through the second dielectric layer and electrically contact the first conductive blind holes respectively. The patterned circuit layer electrically contacts the second conductive blind holes. A manufacturing method of the multi-layer circuit structure is also provided.

12 Claims, 9 Drawing Sheets

(51) Int. Cl.
*H05K 3/42* (2006.01)
*H05K 3/00* (2006.01)

(52) U.S. Cl.
CPC ........... *H05K 3/0041* (2013.01); *H05K 3/423* (2013.01); *H05K 3/429* (2013.01); *H05K 3/4679* (2013.01); *H05K 2201/096* (2013.01); *H05K 2201/09509* (2013.01); *H05K 2201/09827* (2013.01); *H05K 2203/107* (2013.01)

(58) Field of Classification Search
USPC .......................................................... 174/264
See application file for complete search history.

(56) References Cited

U.S. PATENT DOCUMENTS

| | | | |
|---|---|---|---|
| 9,232,641 B2 * | 1/2016 | Rokugawa | H05K 1/0298 |
| 9,433,106 B2 * | 8/2016 | Ishida | H05K 3/4038 |
| 2011/0205720 A1 * | 8/2011 | Lee | H01L 21/4857 |
| | | | 361/782 |

\* cited by examiner

MULTI-LAYER CIRCUIT STRUCTURE AND MANUFACTURING METHOD THEREOF

CROSS-REFERENCE TO RELATED APPLICATION

This application claims the priority benefit of Taiwan application serial no. 106135062, filed on Oct. 13, 2017. The entirety of the above-mentioned patent application is hereby incorporated by reference herein and made a part of this specification.

BACKGROUND OF THE INVENTION

1. Field of the Invention

The invention relates to a circuit structure and manufacturing method of the circuit structure and particularly relates to a multi-layer circuit structure and manufacturing method of the multi-layer circuit structure.

2. Description of Related Art

With advances in printed circuit board production technology, in order to allow the printed circuit board to bear more electronic devices within a limited area, a line width of a circuit and a pitch between the circuits on the printed circuit board are becoming smaller and smaller.

Currently, how to manufacture the circuit on the printed circuit board is generally as follows: forming a seed layer on a dielectric layer; afterwards, forming a photoresist layer on the seed layer and removing part of the photoresist layer according to the layout of the circuit (that is, patterning the photoresist layer through exposure) to expose a specific area of the seed layer; afterwards, electroplating the seed layer exposed outside the photoresist layer to form a conductive layer; and removing the photoresist layer to obtain a circuit. However, if the dielectric layer has poor flatness, the line width of the circuit that is obtained later and the pitch between the circuits have larger variances, and even a short circuit takes place.

SUMMARY OF THE INVENTION

The invention relates to a multi-layer circuit structure of good reliability.

The invention relates to a method of manufacturing a multi-layer circuit structure that raises the yield rate of the production.

A multi-layer circuit structure includes a core layer, a first circuit structure, a second circuit structure and a build-up circuit structure. The core layer has a first surface and a second surface opposite to each other. The first circuit structure is disposed on the first surface. The second circuit structure is disposed on the second surface and is electrically connected to the first circuit structure. The build-up circuit structure includes a first dielectric layer, a plurality of first conductive blind holes, a second dielectric layer, a plurality of second conductive blind holes and a patterned circuit layer. The first dielectric layer is disposed on the first circuit structure. The first conductive blind holes penetrate through the first dielectric layer and electrically contact the first circuit structure. The second dielectric layer is disposed on the first dielectric layer. The second conductive blind holes penetrate through the second dielectric layer and electrically contact the first conductive blind holes respectively. The patterned circuit layer is disposed on the second dielectric layer and electrically contacts the second conductive blind holes.

In one embodiment of the invention, each of the first conductive blind holes is aligned with the corresponding second conductive blind hole.

In one embodiment of the invention, a largest outer diameter of each of the second conductive blind holes is smaller than a largest outer diameter of the corresponding first conductive blind hole.

In one embodiment of the invention, a bottom surface of each of the second conductive blind holes contacts a top surface of the corresponding first conductive blind hole, and an area of the bottom surface of each of the second conductive blind holes is smaller than an area of the top surface of the corresponding first conductive blind hole.

In one embodiment of the invention, the multi-layer circuit structure further includes a plurality of conductive through holes. The conductive through holes penetrate through the core layer to electrically connect the first circuit structure and the second circuit structure.

A method of manufacturing a multi-layer circuit structure includes the following steps: Forming a first circuit structure and a second circuit structure on two opposite surfaces of a core layer respectively, the first circuit structure and the second circuit structure being electrically connected to each other; forming a first dielectric layer on the first circuit structure; forming a plurality of first conductive blind holes in the first dielectric layer and allowing the first conductive blind holes to electrically contact the first circuit structure; forming a second dielectric layer on the first dielectric layer; forming a plurality of second conductive blind holes in the second dielectric layer and allowing the second conductive blind holes to electrically contact the first conductive blind holes respectively; and forming a patterned circuit layer on the second dielectric layer and allowing the patterned circuit layer to electrically contact the second conductive blind holes.

In one embodiment of the invention, the method of manufacturing the multi-layer circuit structure further includes: patterning the first dielectric layer to form a plurality of first blind holes exposing the first circuit structure; forming a first conductive layer on the first dielectric layer and allowing the first conductive layer to further fill up the first blind holes to contact the first circuit structure; and removing the first conductive layer located on the first dielectric layer by rubbing and removing part of the first dielectric layer. The first conductive layer located in the first blind holes forms the first conductive blind holes.

In one embodiment of the invention, the method of manufacturing the multi-layer circuit structure further includes: patterning the second dielectric layer to form a plurality of second blind holes that are aligned with the first conductive blind holes respectively and expose the first conductive blind holes respectively; forming a photoresist layer on the second dielectric layer; patterning the photoresist layer to form a plurality of third blind holes and a plurality of fourth blind holes, the fourth blind holes being aligned with the second blind holes respectively and exposing the second blind holes respectively; forming a second conductive layer in the third blind holes and the fourth blind holes and allowing the second conductive layer located in the fourth blind holes to further fill up the second blind holes to contact the first conductive blind holes; and removing the photoresist layer. The second conductive layer located in the second blind holes forms the second conductive blind holes, and the second conductive layer located on the second dielectric layer forms the patterned circuit layer.

In one embodiment of the invention, the method of manufacturing the multi-layer circuit structure further includes: forming a plurality of conductive through holes penetrating through the core layer to electrically connect the first circuit structure and the second circuit structure before forming the first circuit structure and the second circuit structure on the two opposite surfaces of the core layer respectively.

Based on the above, the method of manufacturing the multi-layer circuit structure is to form the second dielectric layer on the flat first dielectric layer, so the second dielectric layer also has good flatness. Therefore, circuits formed later on the second dielectric layer do not become askew, twisted or deformed. Demand for narrow line width and fine pitch is not only met, but a short circuit is also avoided. In other words, the invention of the method of manufacturing the multi-layer circuit structure helps raise the yield rate of the production, and the obtained multi-layer circuit structure is of good reliability.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
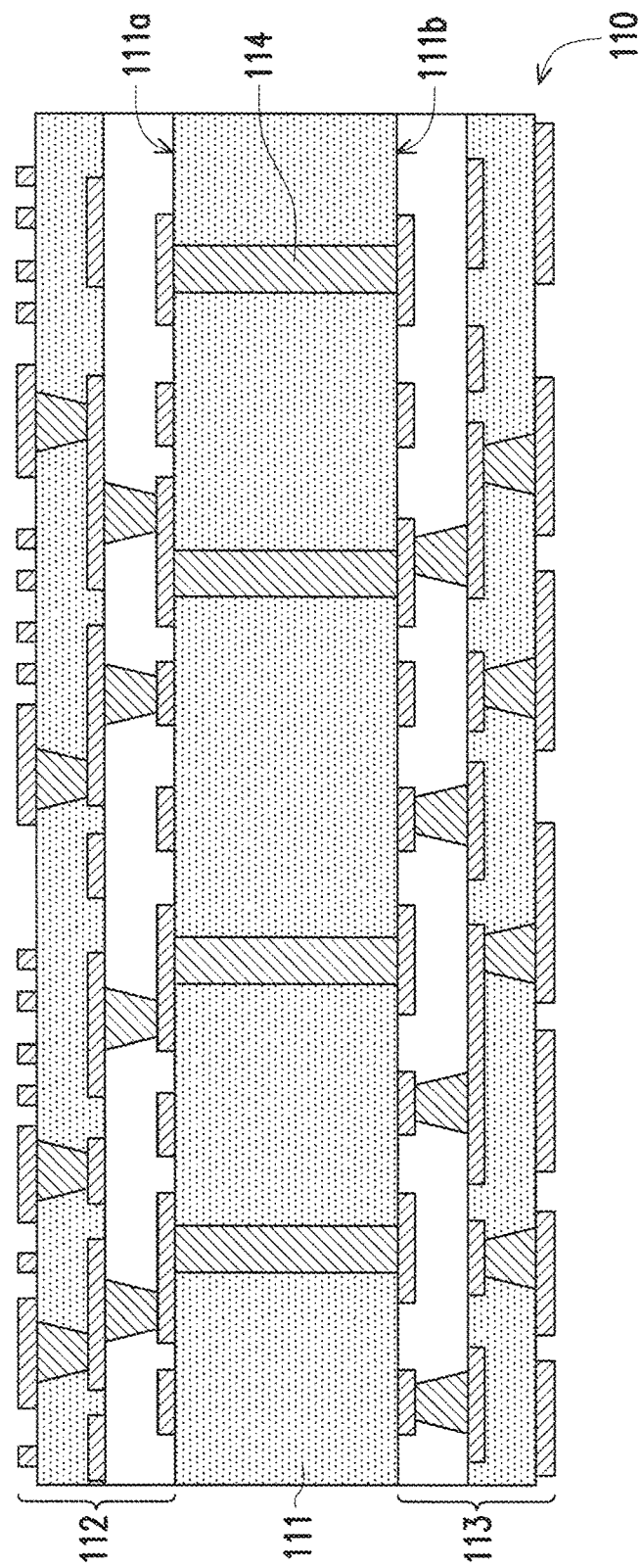
FIGS. 1 to 9 are cross-sectional views of a manufacturing process of a multi-layer circuit structure of an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 to 9 are cross-sectional views of a manufacturing process of a multi-layer circuit structure of an embodiment of the invention. FIG. 1 illustrates a double-sided circuit structure 110. The double-sided circuit structure 110 includes a core layer 111, a first circuit structure 112 and a second circuit structure 113, and the layer number of circuit layers of the first circuit structure 112 and the layer number of circuit layers of the second circuit structure 113 are at least two respectively. The core layer 111 has a first surface 111a and a second surface 111b opposite to each other. The first circuit structure 112 is disposed on the first surface 111a, and the second circuit structure 113 is disposed on the second surface 111b. Further, the double-sided circuit structure 110 further includes a plurality of conductive through holes 114. The conductive through holes 114 penetrate through the core layer 111 (or penetrate through the first surface 111a and the second surface 111b) to electrically connect the first circuit structure 112 and the second circuit structure 113.

In terms of the manufacturing steps of the double-sided circuit structure 110, first, the core layer 111 is provided, and the conductive through holes 114 penetrating through the core layer 111 are formed. Afterwards, the first circuit structure 112 is formed on the first surface 111a, and the circuit layers in the first circuit structure 112 that are connected to the first surface 111a electrically contact one end of the conductive through holes 114. On the other hand, the second circuit structure 113 is formed on the second surface 111b, and the circuit layers in the second circuit structure 113 that are connected to the second surface 111b electrically contact the other end of the conductive through holes 114. That is to say, the conductive through holes 114 are configured to electrically connect the first circuit structure 112 and the second circuit structure 113.

Figure 2:
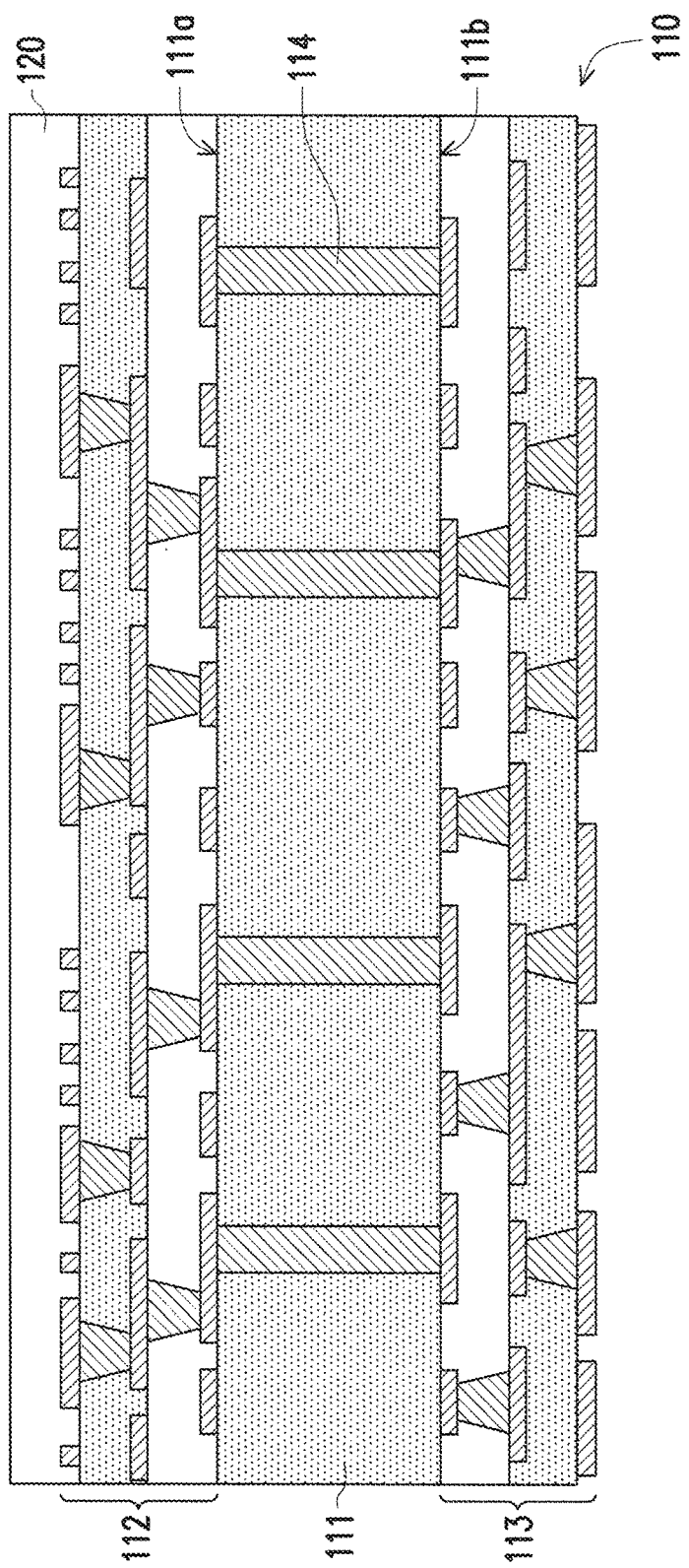
Figure 3:
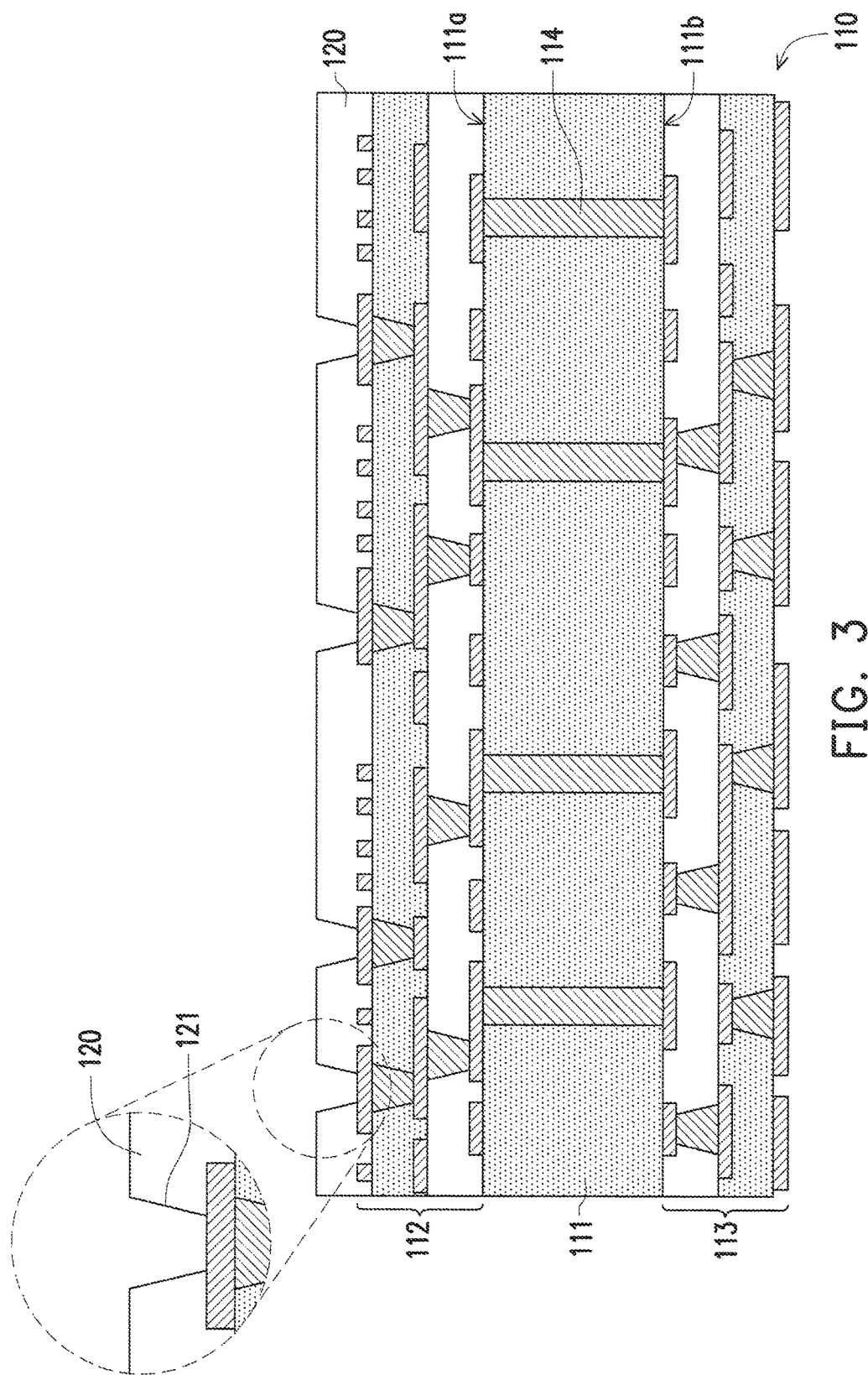
Figure 4:
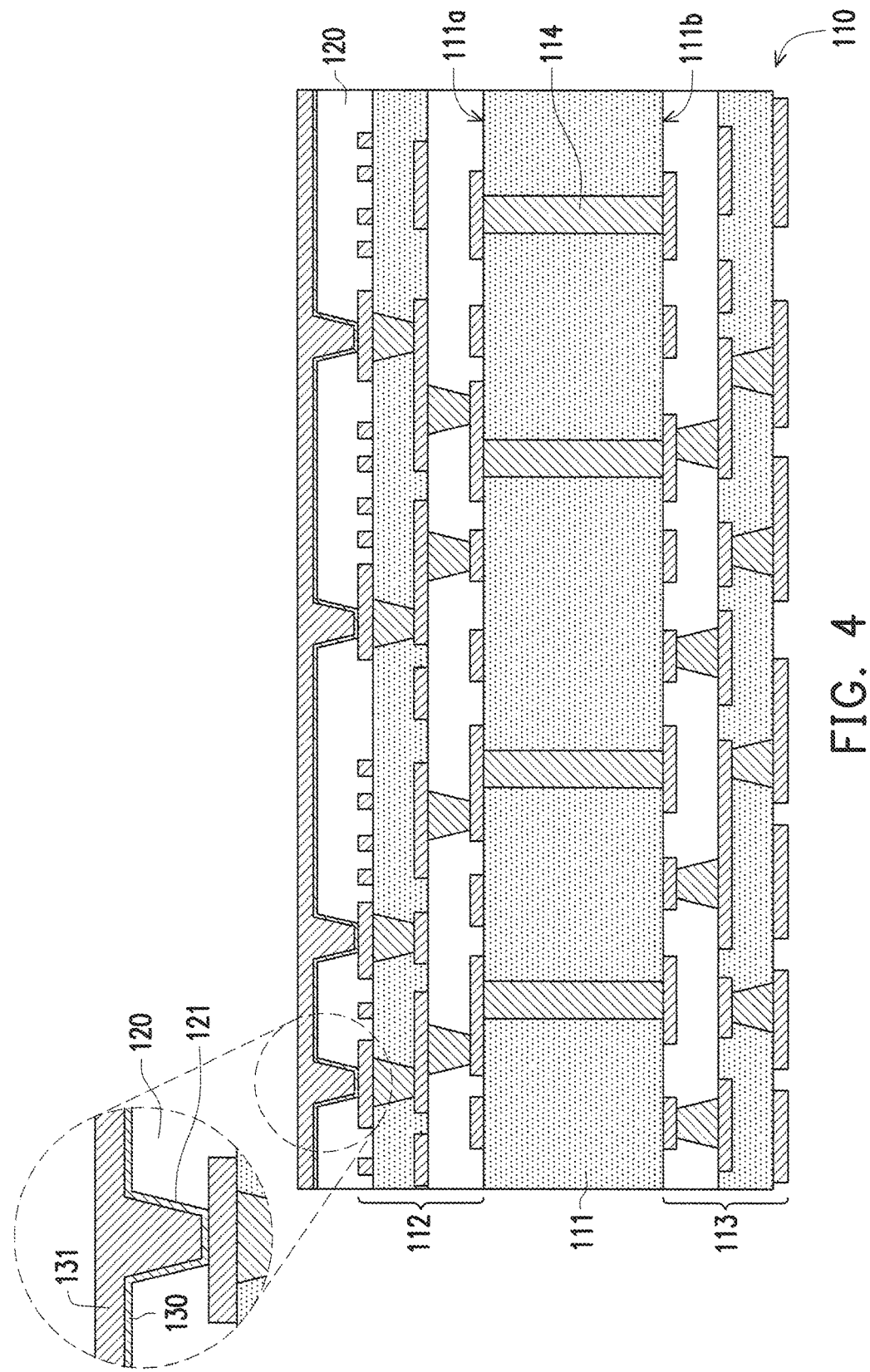

Referring to FIG. 2, a first dielectric layer 120 is formed on the first circuit structure 112, and the first dielectric layer 120 and the core layer 111 are located on two opposite sides of the first circuit structure 112 respectively. Referring to FIG. 3, the first dielectric layer 120 is patterned through laser drill or plasma etching to form a plurality of first blind holes 121, and the first blind holes 121 expose the first circuit structure 112. Referring to FIG. 4, a seed layer 130 is formed on the first dielectric layer 120 and in the first blind holes 121 through sputtering or deposition methods, and the seed layer 130 located in the first blind holes 121 contacts the first circuit structure 112. The seed layer 130 located in the first blind holes 121 does not fill up the first blind holes 121 as the seed layer 130 is thin. Afterwards, a first conductive layer 131 is formed on the first dielectric layer 120 through an electroplating method and allowed to fill up the first blind holes 121 to contact the first circuit structure 112. Further, the first conductive layer 131 is electroplated to be formed on the seed layer 130, and the first conductive layer 131 located in the first blind holes contacts the first circuit structure 112 through the seed layer 130.

Figure 5:
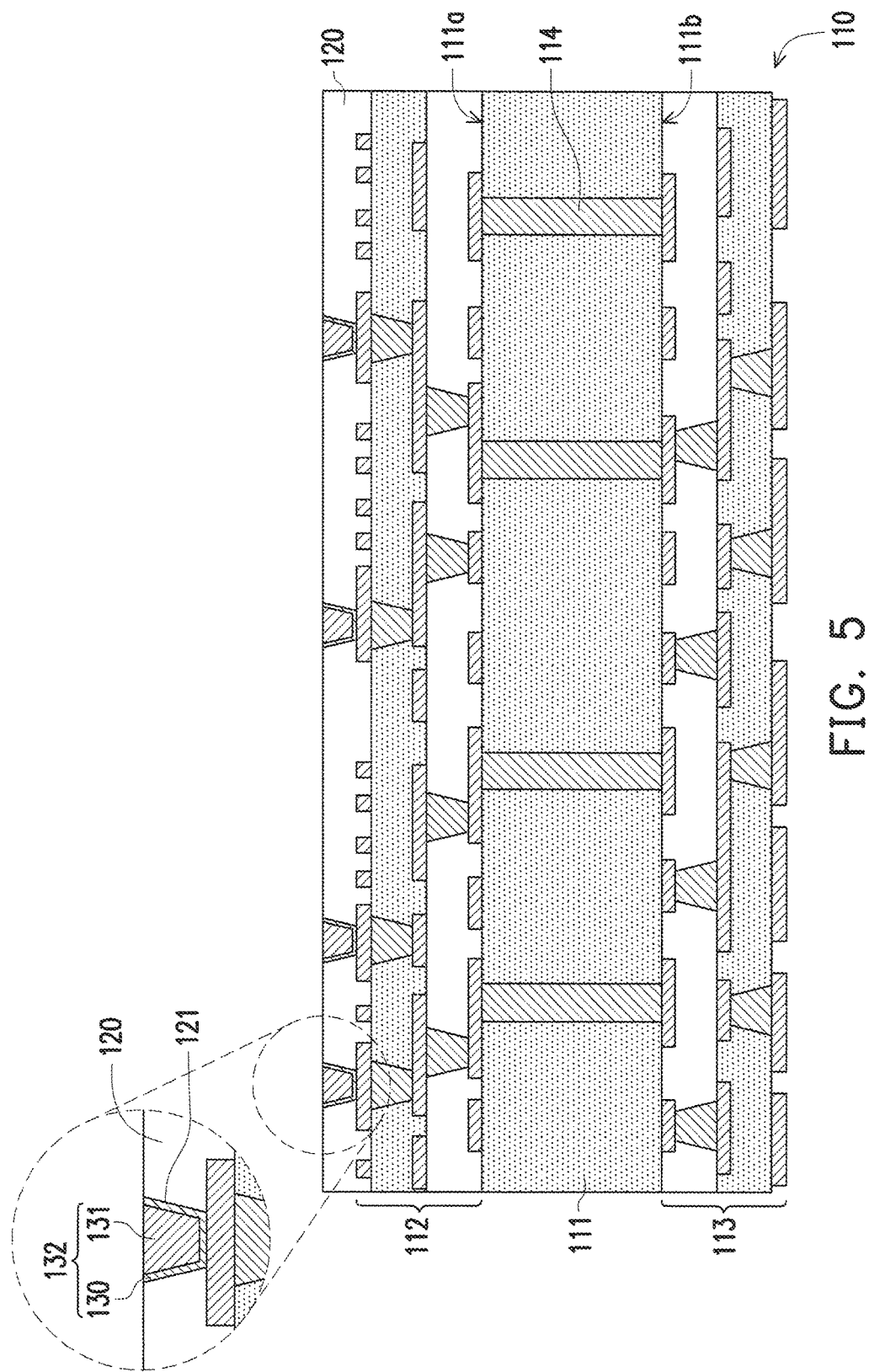

Referring to FIG. 5, the first conductive layer 131 and the seed layer 130 that are located on the first dielectric layer 120 are removed through rubbing or other levelling methods, and part of the first dielectric layer 120 is removed to allow an exposed surface of the first dielectric layer 120 to have good flatness. Accordingly, a thickness of the first dielectric layer 120 in FIG. 5 is smaller than a thickness of the first dielectric layer 120 in FIG. 4. On the other hand, the first conductive layer 131 and the seed layer 130 that are located in the first blind holes 121 and are not removed form a plurality of first blind holes 132. At this moment, the first conductive blind holes 132 are formed in the first dielectric layer 12 and electrically contact the first circuit structure 112.

Figure 6:
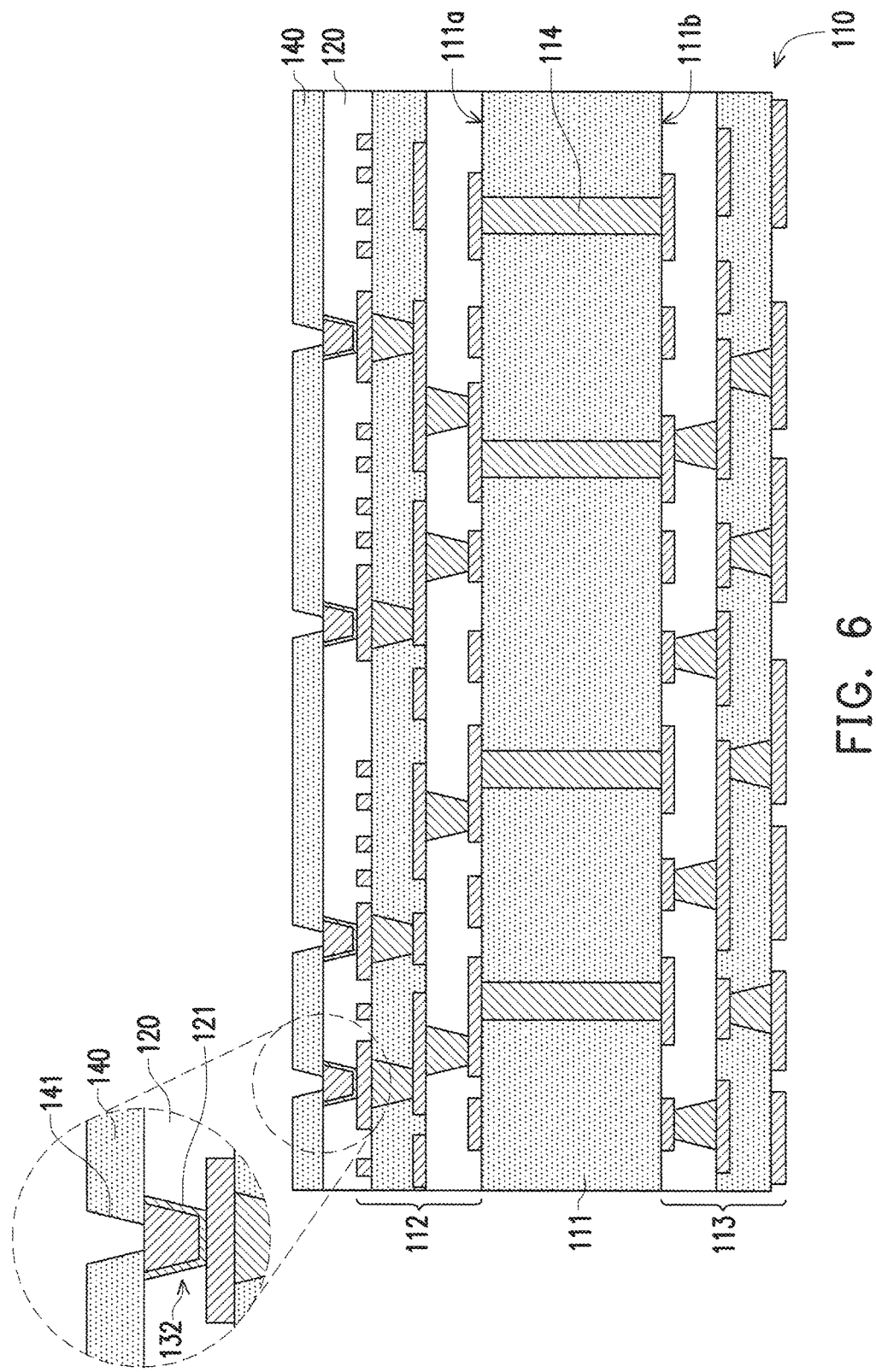

Referring to FIG. 6, a second dielectric layer 140 is formed on the first dielectric layer 120. As the exposed surface of the first dielectric layer 120 has good flatness, the second dielectric layer 140 formed on the first dielectric layer 120 also has good flatness. In this connection, it is preventable that circuits formed later on the second dielectric layer 140 become askew, twisted or deformed. Demand for narrow line width and fine pitch is not only met, but a short circuit is also avoided. The second dielectric layer 140 is patterned through laser drill or plasma etching to form a plurality of second blind holes 141. The second blind holes 141 are aligned with the first conductive blind holes 132 respectively and expose the first conductive blind holes 132 respectively. A largest outer diameter of each of the second blind holes 141 is smaller than a largest outer diameter of the corresponding first conductive blind hole 132.

Figure 7:
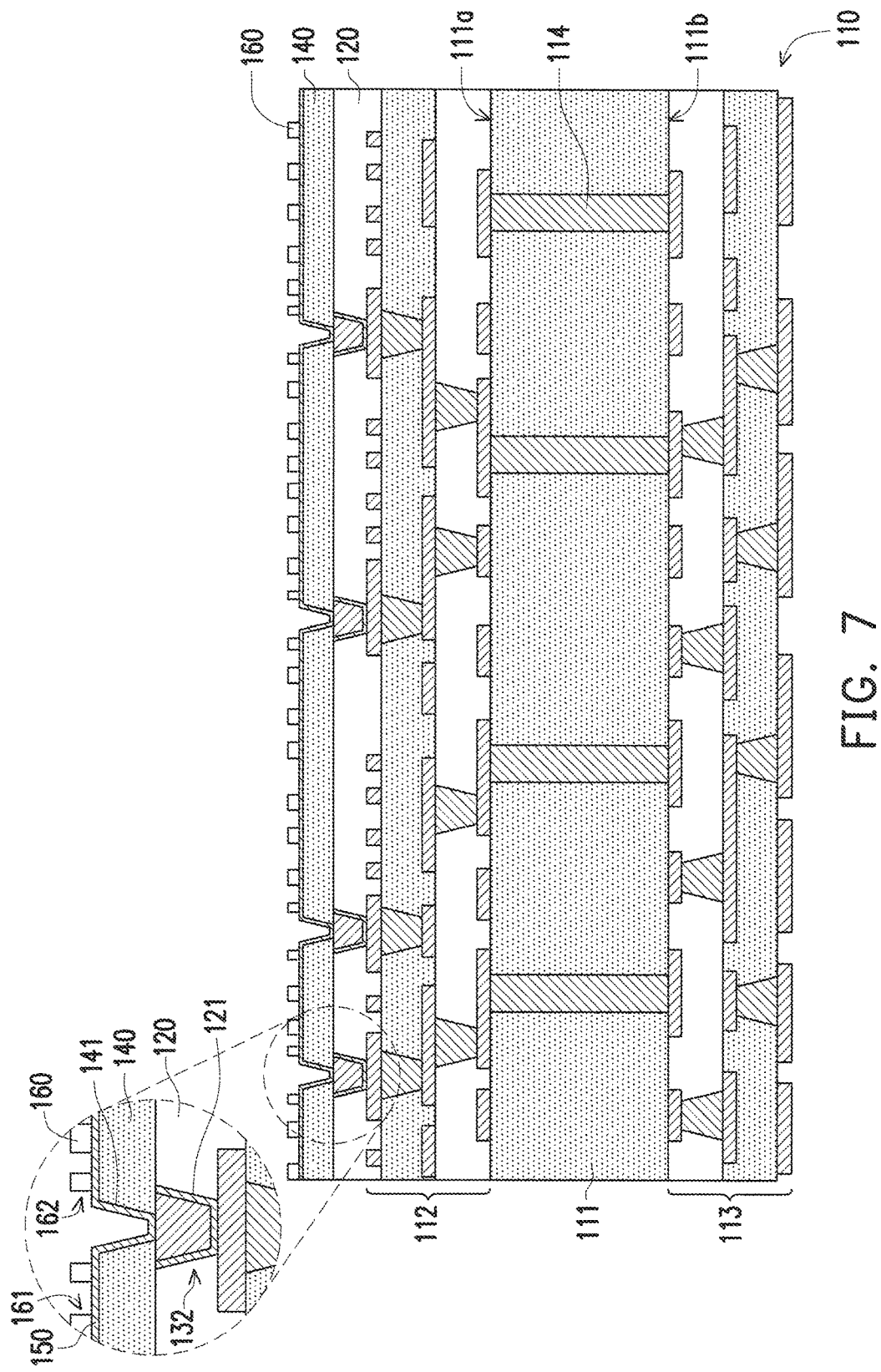

Referring to FIG. 7, a seed layer 150 is formed on the second dielectric layer 140 and in the second blind holes 141 through sputtering or deposition methods. The seed layer 150 located in the second blind holes 141 fails to fill up the second blind holes 141 as the seed layer 150 is thin. A photoresist layer 160 is formed on the second dielectric layer 140 and patterned through the exposure method to form a plurality of third blind holes 161 and a plurality of fourth blind holes 162. The third blind holes 161 expose the seed layer 150 located on the second dielectric layer 140. The fourth blind holes 162 are aligned with the second blind holes 141 respectively and expose the seed layer 150 located in the second blind holes 141. For example, a diameter of apertures of the fourth blind holes 162 may be equal, and the diameter of the aperture of each of the fourth blind holes 162 may be equal to or larger than a largest outer diameter of the corresponding second blind hole 141.

Figure 8:
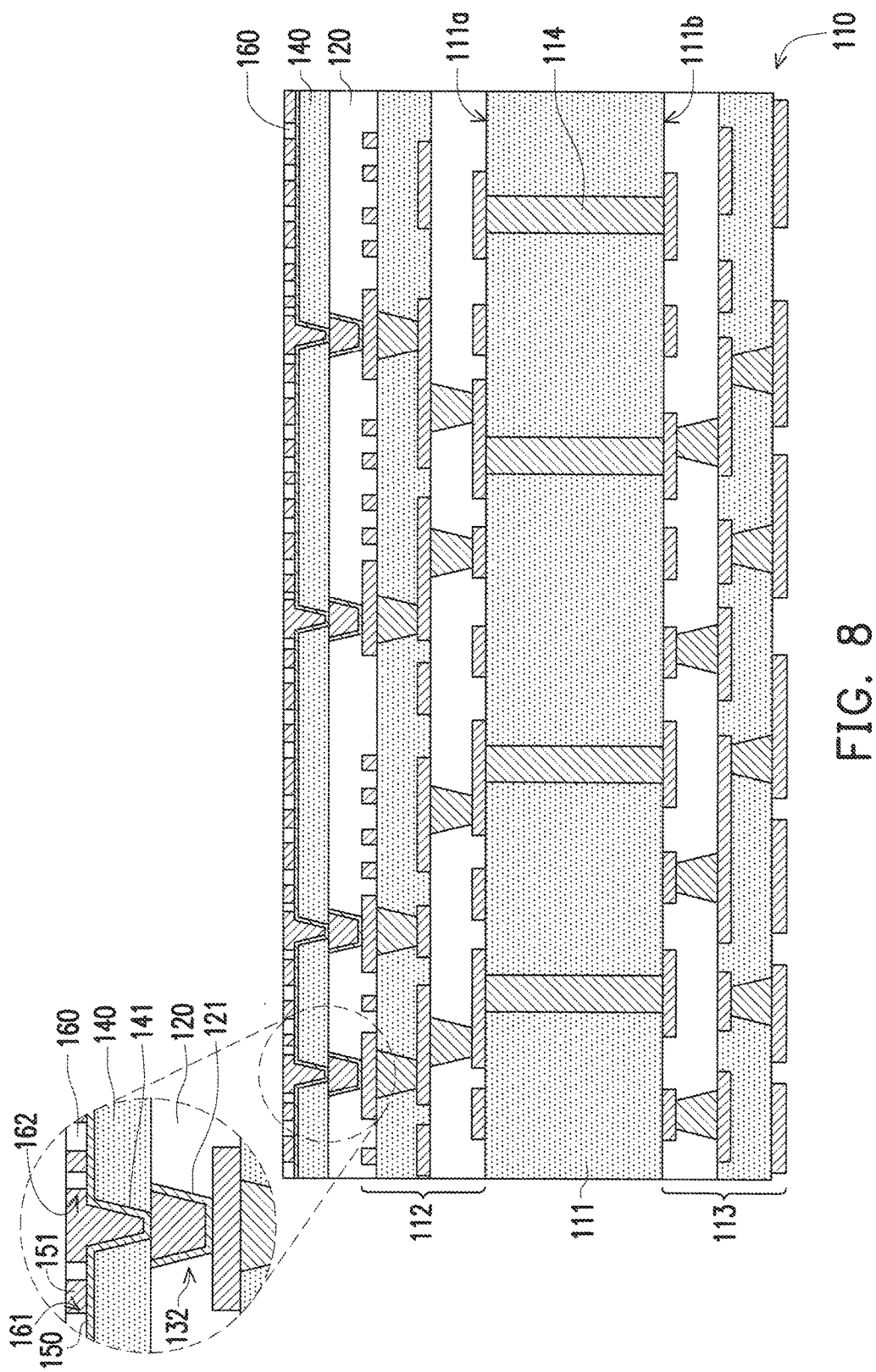

Referring to FIG. 8, a second conductive layer 151 is formed in the third blind holes 161 and in each group of the fourth blind hole 162 and the second blind hole 141 aligned with each other through the sputtering method. The third blind holes 161 are filled up by the second conductive layer 151, and each group of the fourth blind hole 162 and the second blind hole 141 aligned with each other is filled by the second conductive layer 151. The second conductive layer 151 located in the third blind holes 161 contacts the second dielectric layer 140 through the seed layer 150, and the second conductive layer 151 located in each group of the fourth blind hole 162 and the second blind hole 141 aligned with each other contacts the first conductive blind holes 132 through the seed layer 150.

Figure 9:
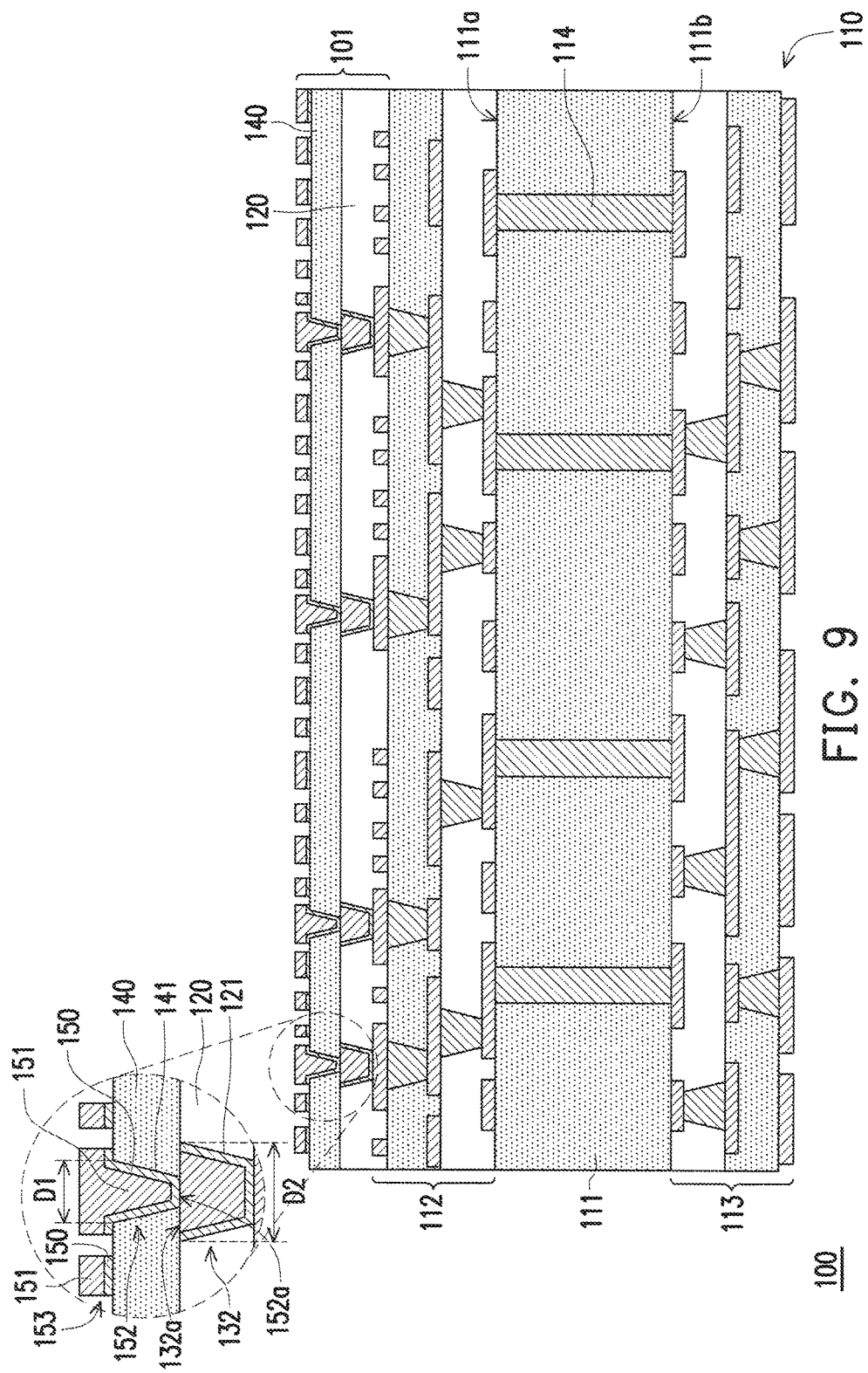

Referring to FIG. 9, the photoresist layer 160 and the seed layer 150 covered by the photoresist layer 160 are removed. A plurality of second conductive blind holes 152 are formed in the second conductive layer 151 and the seed layer 150 that are located in the second blind holes 141, and the second conductive layer 151 and the seed layer 150 that are located on the second dielectric layer 140 form a patterned circuit layer 153. At this moment, the second blind holes 152 are formed in the second dielectric layer 140 and electrically contact the first conductive blind holes 132 respectively, and the patterned circuit layer 153 is formed on the second dielectric layer 140 and electrically contacts the second conductive blind holes 152.

During the manufacturing process of the multi-layer circuit structure 100 of the embodiments, particularly because of levelling the first dielectric layer 120 while forming a build-up circuit structure 101, the second dielectric layer 140 formed later on the first dielectric layer 120 has good flatness. Therefore, the patterned circuit layer 153 formed later on the second dielectric layer 140 does not become askew, twisted or deformed. Demand for narrow line width and fine pitch is not only met, but a short circuit is also avoided. In other words, the manufacturing method of the multi-layer circuit structure 100 helps raise the yield rate of the production, and the obtained multi-layer circuit structure 100 is of good reliability.

Referring to FIG. 9, in this embodiment, the build-up circuit structure 101 includes the first dielectric layer 120, the plurality of first conductive blind holes 132, the second dielectric layer 140, the plurality of second conductive blind holes 152 and the patterned circuit layer 153. The first dielectric layer 120 is disposed on the first circuit structure 112. The first conductive blind holes 132 penetrate through the first dielectric layer 120 and electrically contact the first circuit structure 112. The second dielectric layer 140 is disposed on the first dielectric layer 120. The second conductive blind holes 152 penetrate through the second dielectric layer 140 and electrically contact the first conductive blind holes 132 respectively. The patterned circuit layer 153 is disposed on the second dielectric layer 140 and electrically contacts the second conductive blind holes 152.

To be more specific, each of the first blind holes 132 is aligned with the corresponding second conductive blind hole 152, and a largest outer diameter D1 of each of the second conductive blind holes 152 is smaller than a largest outer diameter D2 of each of the corresponding first blind hole 132. On the other hand, a bottom surface 152a of each of the second conductive blind holes 152 contacts a top surface 132a of the corresponding first blind hole 132, and an area of the bottom surface 152a of each of the second conductive blind holes 152 is smaller than an area of the top surface 132a of the corresponding first blind hole 132. That is to say, circuits located on two opposite sides of the first dielectric layer 120 and the second dielectric layer 140 can be electrically connected through each group of the first conductive blind hole 132 and the second conductive blind hole 152.

In view of the foregoing, the method of manufacturing the multi-layer circuit structure is to remove part of the first dielectric layer through rubbing, so as to allow the exposed surface of the first dielectric layer to have good flatness. Afterwards, the second dielectric layer is formed on the exposed surface of the first dielectric layer, so the second dielectric layer also has good flatness. Therefore, circuits formed later on the second dielectric layer do not become askew, twisted or deformed. Demand for narrow line width and fine pitch is not only met, but a short circuit is also avoided. In other words, the invention of the method of manufacturing the multi-layer circuit structure helps raise the yield rate of the production, and the obtained multi-layer circuit structure is of good reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-layer circuit structure, comprising:
   a core layer, having a first surface and a second surface opposite to each other;
   a first circuit structure, disposed on the first surface;
   a second circuit structure, disposed on the second surface and electrically connected to the first circuit structure; and
   a build-up circuit structure, comprising:
      a first dielectric layer, disposed on the first circuit structure;
      a plurality of first conductive blind holes, penetrating through the first dielectric layer and electrically contacting the first circuit structure, wherein a top surface of each of the first conductive blind holes is coplanar with a top surface of the first dielectric layer;
      a second dielectric layer, disposed on the first dielectric layer, wherein the top surface of each of the first conductive blind holes is coplanar with a bottom surface of the second dielectric layer, and there are only the plurality of first conductive blind holes between the first dielectric layer and the second dielectric layer, wherein each of the first conductive blind holes comprises:
         a first conductive layer; and
         a seed layer, wherein a top surface of the seed layer, a top surface of the first conductive layer, the top surface of the first dielectric layer, and the bottom surface of the second dielectric layer are coplanar, wherein the bottom surface of the second dielectric layer directly and only contacts the top surface of the seed layer, the top surface of the first conductive layer, and the top surface of the first dielectric layer;

a plurality of second conductive blind holes, penetrating through the second dielectric layer and electrically contacting the first conductive blind holes respectively; and a patterned circuit layer, disposed on the second dielectric layer and electrically contacting the second conductive blind holes.

2. The multi-layer circuit structure of claim 1, wherein each of the first conductive blind holes is aligned with the corresponding second conductive blind hole.

3. The multi-layer circuit structure of claim 1, wherein a largest outer diameter of each of the second conductive blind holes is smaller than a largest outer diameter of the corresponding first conductive blind hole.

4. The multi-layer circuit structure of claim 1, wherein a bottom surface of each of the second conductive blind holes contacts a top surface of the corresponding first conductive blind hole, and an area of the bottom surface of each of the second conductive blind holes is smaller than an area of the top surface of the corresponding first conductive blind hole.

5. The multi-layer circuit structure of claim 1, further comprising:

a plurality of conductive through holes, penetrating through the core layer to electrically connect the first circuit structure and the second circuit structure.

6. A method of manufacturing a multi-layer circuit structure, comprising:

forming a first circuit structure and a second circuit structure on two opposite surfaces of a core layer respectively, the first circuit structure and the second circuit structure being electrically connected to each other;

forming a first dielectric layer on the first circuit structure;

forming a plurality of first conductive blind holes in the first dielectric layer and allowing the first conductive blind holes to electrically contact the first circuit structure, wherein a top surface of each of the first conductive blind holes is coplanar with a top surface of the first dielectric layer;

forming a second dielectric layer on the first dielectric layer, wherein the top surface of each of the first conductive blind holes is coplanar with a bottom surface of the second dielectric layer, and there are only the plurality of first conductive blind holes between the first dielectric layer and the second dielectric layer, wherein each of the first conductive blind holes comprises:

a first conductive layer; and a seed layer, wherein a top surface of the seed layer, a top surface of the first conductive layer, the top surface of the first dielectric layer, and the bottom surface of the second dielectric layer are coplanar, wherein the bottom surface of the second dielectric layer directly and only contacts the top surface of the seed layer, the top surface of the first conductive layer, and the top surface of the first dielectric layer;

forming a plurality of second conductive blind holes in the second dielectric layer and allowing the second conductive blind holes to electrically contact the first conductive blind holes respectively; and forming a patterned circuit layer on the second dielectric layer and allowing the patterned circuit layer to electrically contact the second conductive blind holes.

7. The method of claim 6, further comprising:

patterning the first dielectric layer to form a plurality of first blind holes, the first blind holes exposing the first circuit structure;

forming the seed layer on the first dielectric layer and allowing the seed layer to contact the first circuit structure;

forming the first conductive layer on the seed layer and allowing the first conductive layer to further fill up the first blind holes to contact the seed layer; and removing the seed layer and the first conductive layer located on the first dielectric layer by rubbing and removing part of the first dielectric layer, wherein the seed layer and the first conductive layer located in the first blind holes forms the first conductive blind holes.

8. The method of claim 7, further comprising:

patterning the second dielectric layer to form a plurality of second blind holes, wherein the second blind holes are aligned with the first conductive blind holes respectively and expose the first conductive blind holes respectively;

forming a photoresist layer on the second dielectric layer;

patterning the photoresist layer to form a plurality of third blind holes and a plurality of fourth blind holes, wherein the fourth blind holes are aligned with the second blind holes respectively and expose the second blind holes respectively;

forming a second conductive layer in the third blind holes and the fourth blind holes and allowing the second conductive layer located in the fourth blind holes to further fill up the second blind holes to contact the first conductive blind holes; and removing the photoresist layer, wherein the second conductive layer located in the second blind holes forms the second conductive blind holes, and the second conductive layer located on the second dielectric layer forms the patterned circuit layer.

9. The method of claim 6, wherein each of the first conductive blind holes is aligned with the corresponding second conductive blind hole.

10. The method of claim 6, wherein a largest outer diameter of each of the second conductive blind holes is smaller than a largest outer diameter of the corresponding first conductive blind holes.

11. The method of claim 6, wherein a bottom surface of each of the second conductive blind holes contacts a top surface of the corresponding first conductive blind hole, and an area of the bottom surface of each of the second conductive blind holes is smaller than an area of the top surface of the corresponding first conductive blind hole.

12. The method of claim 6, further comprising:

forming a plurality of conductive through holes penetrating through the core layer to electrically connect the first circuit structure and the second circuit structure before forming the first circuit structure and the second circuit structure on the two opposite surfaces of the core layer respectively.

* * * * *